United States Patent [19]

Swirbel et al.

[11] Patent Number: 5,693,455
[45] Date of Patent: Dec. 2, 1997

[54] METHOD FOR CREATING A PATTERN HAVING STEP FEATURES IN A PHOTOPOLYMER USING A THERMAL MASK

[75] Inventors: Thomas J. Swirbel, Davie; Dale W. Dorinski, Coral Springs, both of Fla.

[73] Assignee: Motorola, Inc., Schaumburg, Ill.

[21] Appl. No.: 498,865

[22] Filed: Jul. 6, 1995

Related U.S. Application Data

[62] Division of Ser. No. 300,617, Sep. 2, 1994, abandoned.

[51] Int. Cl.[6] .............................. G03C 5/16; G03C 5/04
[52] U.S. Cl. .................. 430/326; 430/327; 430/330; 430/394; 430/396; 430/944; 430/349
[58] Field of Search ............................... 430/326, 327, 430/330, 349, 394, 944, 945, 396

[56] References Cited

U.S. PATENT DOCUMENTS

| | | | |
|---|---|---|---|
| 3,650,796 | 3/1972 | Jackson et al. | 117/8 |
| 4,054,483 | 10/1977 | Peiffer | 156/632 |
| 4,863,827 | 9/1989 | Jain et al. | 430/145 |
| 5,012,068 | 4/1991 | Anderson | 219/10.55 M |
| 5,134,058 | 7/1992 | Han | 430/327 |
| 5,157,407 | 10/1992 | Peiffer | 427/54 |
| 5,221,592 | 6/1993 | Khanna et al. | 430/326 X |
| 5,223,288 | 6/1993 | Mendenhall et al. | 426/107 |
| 5,236,812 | 8/1993 | Vassiliou et al. | 430/327 |
| 5,238,787 | 8/1993 | Haluska et al. | 430/325 |
| 5,403,695 | 4/1995 | Hayase et al. | 430/326 X |

*Primary Examiner*—George F. Lesmes
*Assistant Examiner*—Bernard P. Codd
*Attorney, Agent, or Firm*—Dale W. Dorinski

[57] ABSTRACT

A stepped pattern is formed in a photoresist film (10) by heating the photoresist at a first temperature to soft bake it, and then applying a mask (10) that allows only a selected portion (15) of the photoresist to be heated. That portion of the photoresist film is then heated at a temperature sufficient to partially degrade the photoresist, and the mask is removed. Another portion (22) of the photoresist film is then exposed to ultraviolet light to degrade it more fully than in the earlier step. The photoresist film is then developed under conditions sufficient to completely remove the portion exposed to ultraviolet light, and to partially remove the portion heated using the mask, thereby creating a stepped feature in the photoresist film.

5 Claims, 2 Drawing Sheets

METHOD FOR CREATING A PATTERN HAVING STEP FEATURES IN A PHOTOPOLYMER USING A THERMAL MASK

CROSS REFERENCE TO RELATED APPLICATIONS

This application is a division of pending U.S. application Ser. No. 08/300,617, filed Sep. 2, 1994, by Swirbel, et al., entitled "Method of Forming a Pattern with Step Features in a Photopolymer (as amended)", and assigned to Motorola, Inc., now abandoned.

TECHNICAL FIELD

This invention relates in general to photolithography and more particularly to three-dimensional photolithography.

BACKGROUND

Photopolymers are organic polymers that have the unique property that when exposed to light of an appropriate wavelength, they are chemically changed in their solubility in certain solvents. Photopolymers find use in a number of applications, such as adhesives and photoresists. Photoresists are widely used in the electronic industry in the manufacture of semiconductors and printed circuit boards. Two types of photoresists are available: negative acting and positive acting. Negative acting photoresists are initially soluble in a developing solution, but after light exposure, they become polymerized and insoluble in the developer. Positive photoresists work in exactly the opposite fashion. Exposure to light makes the polymer more soluble in the developing solution. Exposure of photoresists to the light is typically made through a film pattern, or it can be done using a laser or other type of light beam that is rastered across an area. The photoresist pattern that remains after development is insoluble and chemically resistant to other solutions, such as the cleaning, plating, and etching solutions commonly used in producing printed circuit boards.

Since photoresists have typically been used as masking agents for etching and other types of solutions, the developing process for photoresists has been an "all or none" situation. That is, process conditions have been optimized in order to completely remove the photoresist from the desired area during a developing cycle. This provides a hole or opening in the photoresist so that the underlying substrate, if any, is exposed. While this is a desirable situation for the production of semiconductors and printed circuit boards, it provides a severe limitation on photoresists that allows them to only be used in these types of applications. It would be highly desirable if a three-dimensional structure could be fabricated using a photoresist, thereby opening the field to many more applications and uses for photopolymers.

SUMMARY OF THE INVENTION

A stepped pattern is formed in a photoresist film by heating the photoresist at a first temperature to soft bake it, and then applying a mask that allows only a selected portion of the photoresist to be heated. That portion of the photoresist film is then heated at a temperature sufficient to partially degrade the photoresist, and the mask is removed. Another portion of the photoresist film is then exposed to ultraviolet light to degrade it more fully than in the earlier step. The photoresist film is then developed under conditions sufficient to completely remove the portion exposed to ultraviolet light, and to partially remove the portion heated using the mask, thereby creating a stepped feature in the photoresist film.

DETAILED DESCRIPTION OF THE PREFERRED EMBODIMENT

Figure 1:
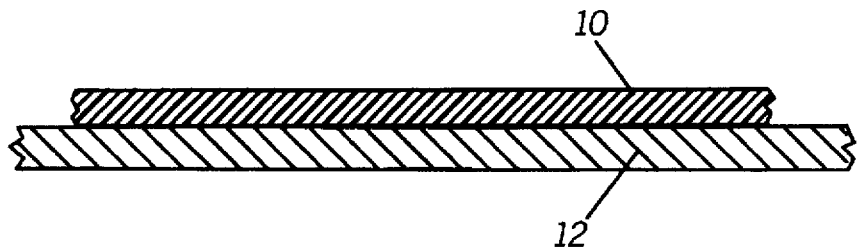
FIGS. 1–5 are cross-sectional views of the various steps in the method of forming a pattern in a photopolymer in accordance with the invention.

While the specification concludes with claims defining the features of the invention that are regarded as novel, it is believed that the invention will be better understood from a consideration of the following description in conjunction with the drawing figures, in which like reference numerals are carried forward. In order to more clearly illustrate selected elements, the drawing figures have intentionally not been drawn to scale.

Figure 2:
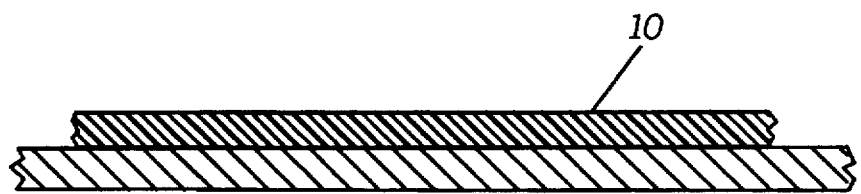
Figure 6:
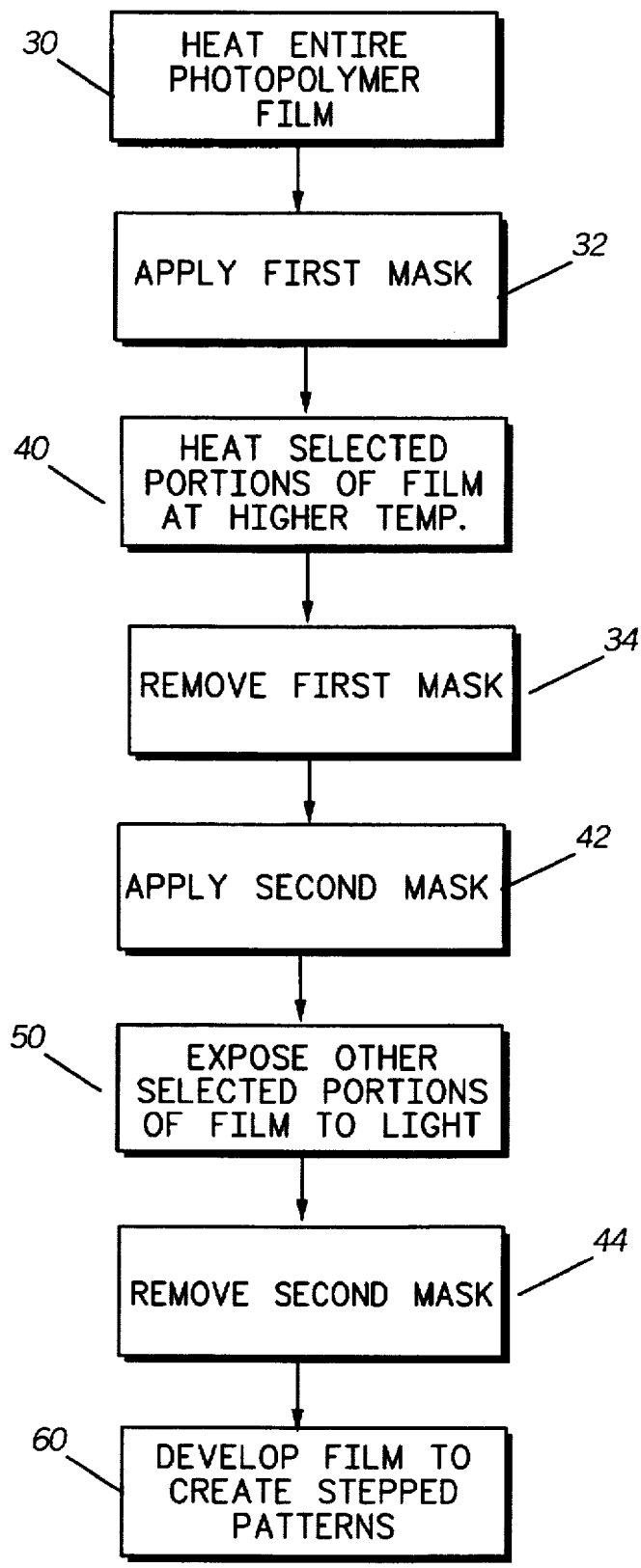
FIG. 6 is a flow chart of the method in accordance with the invention.

In FIG. 6 and specifically now in FIG. 1, a layer of a photopolymer 10, such as a film or layer of photoresist, is provided. Some positive acting photoresists are sold under the AZ series name by Shipley Co. of Newton, Mass. and American Hoechst, with AZ 4620 from American Hoechst being the preferred embodiment. The photoresist 10 may be a free standing film or it may be laminated to an underlying substrate 12. In the case of the manufacture of printed circuit boards or semiconductors, the underlying substrate is typically a piece of copper-clad FR-4 or a silicon wafer. In other applications, it may be a sheet of metal or another type of underlying support structure such as TEFLON®, which would provide easy release of the photopolymer film 10. In FIG. 2, the photopolymer film 10 is heated to a first temperature. This step 30 is often referred to by those skilled in the art as a 'soft bake.' In the case of positive photoresists such as the AZ series, this is typically done at 50°–90° C. The soft bake serves to remove solvents and also to dry and set the photoresist. The soft bake cycle typically runs from two minutes to one hour depending upon the temperature and the thickness of the photoresist. Heating is typically provided by a convection oven or a hot plate, however, other sources of heating such as infrared or conduction heating may be used.

Figure 3:
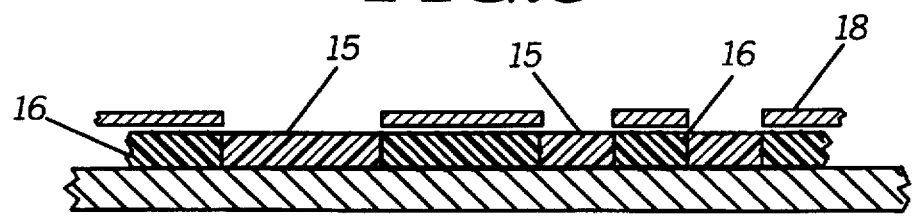

Referring now to FIG. 3, selected portions 15 of the photoresist 10 are heated further. This heating step 40 serves to partially degrade the selected portions 15 of fie photoresist 10, thereby rendering them more soluble in a developing solution. The portions 15 are selectively heated by, for example, applying (step 32) a mask 18 over the photoresist, such that the mask 18 insulates the photoresist from a heat source. The heat can be provided to the photoresist in a number of ways, for example, by infrared energy. In this case an infrared bulb is used to flood expose the selected portions 15 that are desired to be partially polymerized. Other portions 16 remain covered by the mask 18 and, therefore, are not exposed to the infrared radiation and are not heated. Alternatively, convection or conduction heating may be used in the place of infrared. A microwave energy source may alternatively be used to heat the selected portions 15. In this case, the mask 18 would be a material that has a susceptor strategically located at various points within the mask. The mask 18 would then be placed in direct contact with the photoresist 10 and microwave energy provided to the mask heats the areas containing the susceptor. In this case, the susceptor would be directly over those portions 15 that are desired to be heated. Use of a susceptor for heating materials with microwave energy is well known in the art as demonstrated, for example, in U.S. Pat. Nos. 5,012,068 and 5,223,288. Regardless of the method of heating, the heating step creates a latent image that ultimately results in partial developing of the photoresist layer. This renders those portions 15 of the photoresist film 10 somewhat more soluble in a developing material than the unheated portions 16. Typically, the portions 15 are heated to a temperature higher than that used in FIG. 2, for example 90°–120° C. for 30 seconds to 5 minutes, with about 3 minutes being preferred. The mask is removed (step 34) after the heating step 40.

Figure 4:
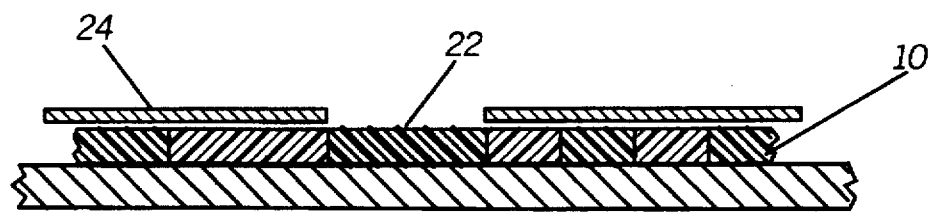

In the next step as shown in FIG. 4, another or a second portion 22 of the photoresist layer 10 is exposed (step 50) to ultraviolet light for a period of time sufficient to further degrade it. The ultraviolet light energy serves to partially break down the photopolymer chain, thereby rendering the degraded photopolymer more soluble in a developing solution. The second portion 22 exposed to ultraviolet light is typically selected to be representative of a desired pattern. The pattern is created by any number of means using a mask 24 or other artwork (as represented in step 42). The proper time for exposing the photoresist will be depend upon the light intensity, the temperature, the photopolymer type, the thickness, and the type of equipment being used. Typical exposure times for various photoresists may be obtained from the manufacturer's data sheets. The light frequency needed for exposure typically varies between 200 and 600 nanometers, and is more preferentially found to be around 320 to 340 nanometers. Exposure tests should be run in order to establish the proper time and intensity of exposure so that the second portion 22 will be totally removed during the developing step. Again, a latent image is provided in the photopolymer film at this point. The applied mask (step 42) is removed (step 44) after the exposing step 50.

Figure 5:
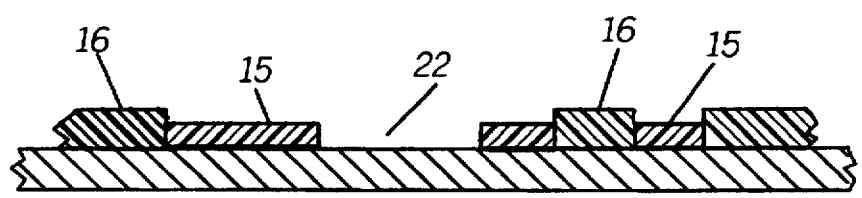

The photoresist or photopolymer film 10 is then developed (step 60). Typical developers are alkali/water solutions, chlorinated solvent blends, or other types of chemical solutions which dissolve the degraded photoresist. The developer dissolves the exposed photoresist very quickly, the partially heated photoresist less quickly, and the unexposed or unheated portions of the photoresist even more slowly. When using an alkali water solution for developing, a water rinse is applied to the developed photoresist in order to remove any residual chemicals. The result of the developing step may be seen in FIG. 5, where the step features of the photoresist are found. The second portion 22 that was exposed to ultraviolet light has been developed completely through the film thickness, thereby exposing the underlying substrate. Those portions 15 that were selectively heated have only been partially developed, because they were less soluble in the developer than second portion 22, thus creating the step feature in the photoresist. Areas 16 that were not heated or not exposed have not been affected by the developing solution and are at their full thickness.

In addition, a final step of further curing the film may be performed in order to provide a more stable and consistent resulting product. Typically, a 100° C. bake for 15–45 minutes is employed. High-temperature baking (in excess of 120° C.) should be avoided because it could be harmful to the photoresist.

It can be appreciated from the foregoing that multi-dimensional features can be created in a photopolymeric film, thereby creating a stepped feature in the film. In order to do this, the coating need only be applied a single time, as opposed to the multiple passes required by the conventional art. Also in the prior art, heat is typically applied to the entire coating strictly for the purpose of removing solvents. Care is always taken to uniformly treat the entire film so that it develops completely and uniformly throughout. The instant invention selectively treats portions of the photopolymeric film in at least two different ways in order to create zones having varying solubility in a developing solution.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming a pattern in a photopolymer, comprising the following steps in the order named:

a) providing a photopolymer layer;

b) heating the entire photopolymer layer at a first temperature;

c) applying a first mask to the photopolymer layer to insulate it from a heat source, the first mask arranged to allow a first portion of the photopolymer layer to be heated by the heat source;

d) heating the first portion of the photopolymer layer at a temperature greater than the first temperature;

e) removing the first mask;

f) applying a second mask over the photopolymer layer, the second mask arranged to reveal a second portion of the photopolymer layer;

g) exposing the revealed second portion of the photopolymer layer to ultraviolet light; and h) developing the photopolymer layer to completely remove the second portion and partially remove the first portion.

2. The method as described in claim 1, wherein the step of providing a photopolymer layer comprises providing a photopolymer layer that is on a substrate.

3. The method as described in claim 1, wherein the photopolymer layer is heated in step (d) by infrared, forced air or microwave sources.

4. A method of forming a pattern in a photoresist, comprising the following steps in the order named:

a) providing a photoresist film;

b) heating the photoresist film at a first temperature to soft bake it;

c) applying a thermal mask to the photoresist film, so that the thermal mask allows only a selected portion of the photoresist film to be heated;

d) heating the selected portion of the photoresist film at a temperature sufficient to partially degrade the photoresist film;

e) removing the thermal mask;

f) applying an optical mask over the photopolymer layer, the optical mask arranged to reveal a second portion of the photopolymer layer:

g) exposing the revealed second portion of the photoresist film to ultraviolet light to degrade it more fully than in step (d); and h) developing the photoresist film under conditions sufficient to completely remove the portion exposed to light in step (f) and to partially remove the portion heated in step (d), thereby creating a stepped feature in the photoresist film.

5. The method as described in claim 4, wherein step (h) comprises developing in a liquid.

* * * * *